US007062933B2

(12) United States Patent
Burns et al.

(10) Patent No.: US 7,062,933 B2
(45) Date of Patent: Jun. 20, 2006

(54) SEPARATE THERMAL AND ELECTRICAL THROTTLING LIMITS IN PROCESSORS

(75) Inventors: James S. Burns, Cupertino, CA (US); Sailesh Kottapalli, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 103 days.

(21) Appl. No.: 10/808,882

(22) Filed: Mar. 24, 2004

(65) Prior Publication Data

US 2005/0210905 A1 Sep. 29, 2005

(51) Int. Cl.
*F25D 23/12* (2006.01)
*G06F 1/26* (2006.01)
*G06F 1/32* (2006.01)

(52) U.S. Cl. ...................... 62/259.2; 713/320; 713/340

(58) Field of Classification Search ............... 62/259.2; 713/320, 322, 340, 500, 501
See application file for complete search history.

(56) References Cited

U.S. PATENT DOCUMENTS

| | | | | |
|---|---|---|---|---|
| 6,487,668 | B1 * | 11/2002 | Thomas et al. | 713/322 |
| 6,624,816 | B1 * | 9/2003 | Jones, Jr. | 345/503 |
| 6,915,441 | B1 * | 7/2005 | Macior wski et al. | 713/340 |
| 2005/0050373 | A1 * | 3/2005 | Orenstien et al. | 713/320 |

* cited by examiner

*Primary Examiner*—Marc Norman
(74) *Attorney, Agent, or Firm*—Alan L. Pedersen-Giles

(57) ABSTRACT

A system may include a first portion and a processor. The first portion may include a first thermal sensor to provide first thermal data. The processor may include a core, a core thermal sensor to provide core thermal data, and an electrical power sensor to provide electrical data. The processor may also include a power management unit to selectively throttle the core based on the first thermal data, the core thermal data, and the electrical data.

25 Claims, 3 Drawing Sheets

SEPARATE THERMAL AND ELECTRICAL THROTTLING LIMITS IN PROCESSORS

BACKGROUND

The claimed invention relates to thermal and performance issues in electrical systems and, more particularly, to throttling electrical systems when certain limits are reached.

Some electrical systems may employ throttling to keep the systems within acceptable operating parameters. Throttling typically involves reducing the voltage and/or frequency to portions of the system (e.g., a processor) to reduce heat generation and/or electrical power usage. Other forms of throttling also exist, such as digital throttling (e.g., issue rate control, etc.). Electrical power sensors may be used to measure voltage and/or current at certain portions of the system and to trigger throttling when the voltage and/or current exceed certain limits. Electrical power sensors, however, typically cannot directly control system temperatures, such as the temperature of a processor in the system.

Thermal sensors may be used to measure heat at certain portions of the system and to trigger throttling when the system becomes too hot. Thermal sensors, however, typically cannot control operation of the system within electrical power specifications.

Electrical and thermal systems typically may employ different technologies and may have different costs.

BRIEF DESCRIPTION OF THE DRAWINGS

The accompanying drawings, which are incorporated in and constitute a part of this specification, illustrate one or more implementations consistent with the principles of the invention and, together with the description, explain such implementations. The drawings are not necessarily to scale, the emphasis instead being placed upon illustrating the principles of the invention. In the drawings.

DETAILED DESCRIPTION

The following detailed description refers to the accompanying drawings. The same reference numbers may be used in different drawings to identify the same or similar elements. In the following description, for purposes of explanation and not limitation, specific details are set forth such as particular structures, architectures, interfaces, techniques, etc. in order to provide a thorough understanding of the various aspects of the invention. However, it will be apparent to those skilled in the art having the benefit of the present disclosure that the various aspects of the invention may be practiced in other examples that depart from these specific details. In certain instances, descriptions of well known devices, circuits, and methods are omitted so as not to obscure the description of the present invention with unnecessary detail.

Figure 1:
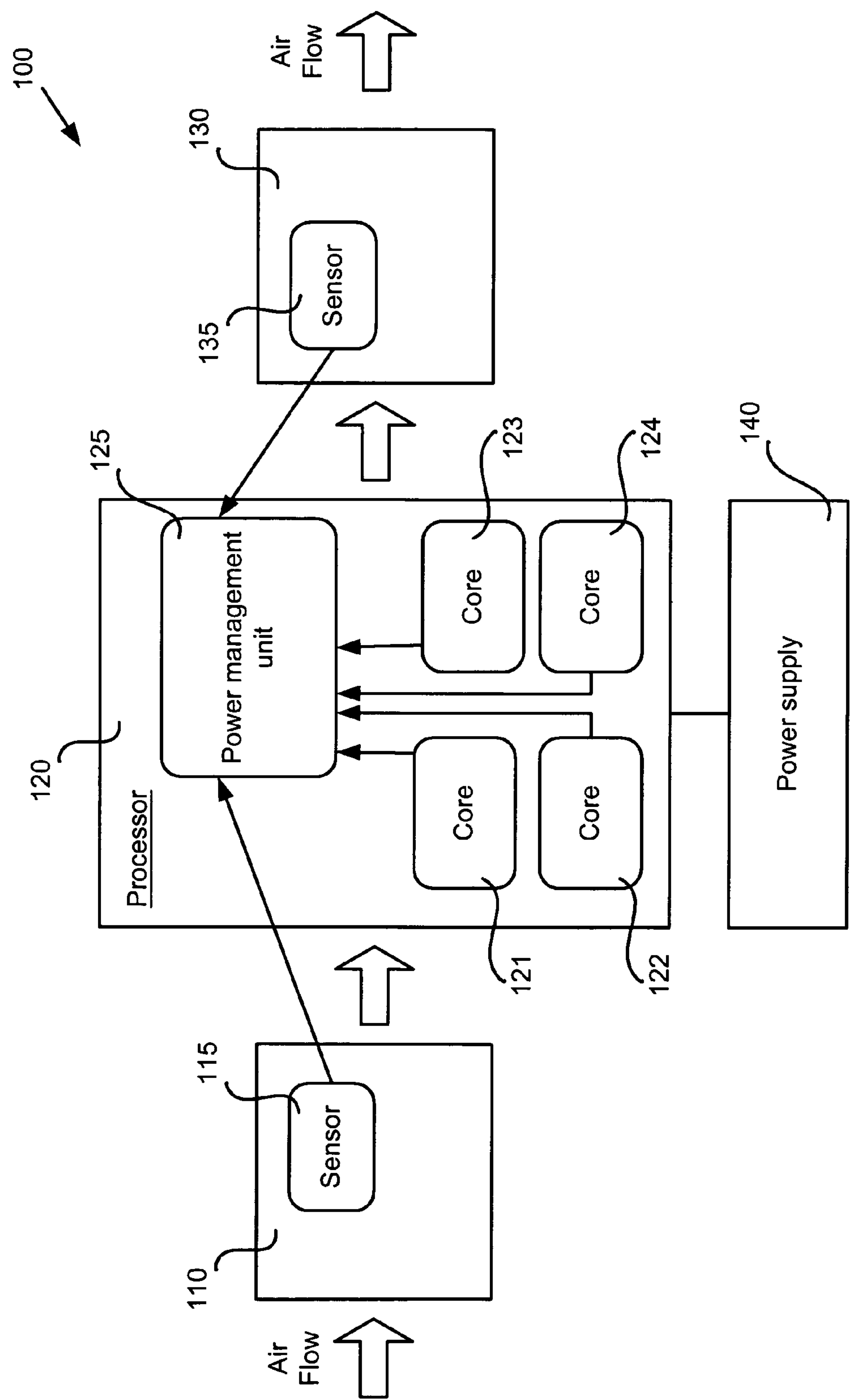
FIG. 1 illustrates an example system consistent with the principles of the invention.

FIG. 1 illustrates a an example system 100 consistent with the principles of the invention. System 100 may include an upstream portion 110, a processor 120, a downstream portion 130, and a power supply 140. Although not explicitly shown, system 100 may also include some mechanism (e.g., one or more fans) for causing airflow across at least elements 110–130. In such airflow, upstream portion 110 may be located upstream in the airflow from processor 120, and downstream portion 130 may be located downstream in the airflow from processor 120.

Upstream portion 110 may include one or more of a power supply, memory, or other components of electronic system 100. Such other components may include, for example, a storage device (e.g., hard disk or optical disk), graphics processors, peripheral component interface (PCI) devices, etc. In some implementations, upstream portion 110 may also include a thermal sensor 115 to sense temperature in upstream portion 110.

In those implementations where thermal sensor 115 is present, thermal sensor 115 may send sensed thermal information to processor 120. In some implementations, thermal sensor 115 may not be present in upstream portion 110, because upstream portion 110 may not be downstream in the airflow from other heat-generating components, such as processor 120. In some cases, upstream portion 110 may not be as prone to overheating as other portions of system 100.

Processor 120 may be located downstream in the airflow in system 100 from upstream portion 110. Processor 120 may include one or more cores 121–124 and a power management unit 125. Core(s) 121–124 may include distinct processing unit(s) within processor 120. These core(s) 121–124 may separately process applications, and may have different processing loads (and thus heat production). Although four cores 121–124 are illustrated in FIG. 1, processor 120 may include as few as one core or a larger number (e.g., eight or more) of cores.

In some implementations, each of cores 121–124 may include a thermal sensor and an electrical power sensor (not shown). In such an implementation, each of cores 121–124 may provide thermal sensor data and electrical sensor data to power management unit 125, where this data may, or may not, be aggregated. In some implementations, each of cores 121–124 may include a thermal sensor (not shown), but processor 120 or system 100 may include one or more electrical sensors (e.g., near a voltage regulator module (VRM)) that measure aggregate electrical power to two or more of cores 121–124. Other implementations of temperature and electrical power sensors are possible and contemplated on processor 120. In such implementations, sufficient sensors may exist on processor 120 to provide power management unit 125 with at least one temperature data. Electrical power may be limited by using at least one electrical sensor, or by limiting voltage and frequency to a level that insures the maximum power is below the electrical limit.

Power management unit 125 may include circuitry to receive and monitor temperature data and electrical power data from sensors in system 100. Power management unit 125 also may include circuitry to control the frequency and/or voltage of cores 121–124 in processor 120 based at least in part on the temperature and electrical power data received from sensors in processor 120 and/or other components of system 100 (e.g., upstream portion 110 and/or downstream portion 130).

Power management unit 125 may include circuitry to throttle processor 120 by reducing the frequency of cores 121–124, reducing the voltage to cores 121–124, or reducing both. In some implementations, throttling may additionally or alternatively include turning off certain microarchitecture features to lower power used by processor 120. In some implementations, power management unit 125 may change the frequency and/or voltage to all of cores 121–124 (e.g., for the whole die or chip) at the same time. In some other implementations, power management unit 125 may change the frequency and/or voltage to only certain ones of cores 121–124 (e.g., one or more cores that are running hot and/or have a high processing load).

In conjunction with controlling core(s) 121–124, power management unit 125 may employ a number of associated power thresholds. For example, circuitry in power management unit 125 may use an electrical power threshold (e.g., 120 Watts (W)) and a separate thermal power threshold (e.g., 100 W) associated with core(s) 121–124. The circuitry in power management unit 125 also may use one or more thermal power thresholds (e.g., 60 W, 120 W, etc.) associated with upstream portion 110 and/or downstream portion 130 when controlling core(s) 121–124 in processor 120.

As used herein, a thermal power threshold may be conceptualized as how much electrical power a component (e.g., processor 120) may take to reach a certain thermal limit under worst-case (or at least sub-optimal) conditions. Such conditions may include, but are not limited to, specified leakage current, altitude, ambient temperature, airflow, thermal interface, and heat-sink characteristics. Typically, thermal power thresholds (e.g., 100 W) may have associated temperature thresholds (e.g., 100° C.) so that the circuitry in power management unit 125 may thermally control based on temperature readings from thermal sensors in core(s) 121–124 and/or portions 110/130. For example, if first portion 110 includes a power supply, it may have a 120 W thermal power threshold, corresponding to an 85° C. temperature threshold, or if first portion 110 includes memory, it may have a 60 W thermal power threshold, corresponding to a 70° C. temperature threshold.

Downstream portion 130 may include one or more of a power supply, memory, or other components of electronic system 100. Such other components may include, for example, a storage device (e.g., hard disk or optical disk), a graphics processor, peripheral component interface (PCI) devices, etc. In some implementations, downstream portion 130 may also include a thermal sensor 135 to sense temperature in downstream portion 130.

In those implementations where thermal sensor 135 is present, thermal sensor 135 may send sensed thermal information to power management unit 125 in processor 120. Because downstream portion 130 may be downstream in the airflow from other heat-generating components, such as processor 120, downstream portion 130 may be somewhat more prone to overheating than other portions of system 100. Although FIG. 1 shows both upstream portion 110 and downstream portion 130, in some implementations one or both of these portions 110/130 (and their respective sensors 115/135) may not be present. For example, the design of system 100 (e.g., placement of processor 120 relatively near an air intake or exit) may obviate any need for one or more of sensors 115/135 for additional thermal sensing.

Power supply 140 may include components for providing electrical power to system 100. For example, power supply 110 may convert voltage from an external power source to one or more direct current (DC) sources (e.g., 3.3 Volts (V), 5 V, 12 V, etc.) for use by system 100. In addition to voltage conversion circuitry, power supply 110 may include signal conditioning circuitry to provide a relatively non-varying and/or transient-free output to system 100. Although power supply 140 is shown connected to processor 120 for ease of illustration, it may also supply electrical power to one or more of upstream portion 110 and downstream portion 130.

Figure 2:
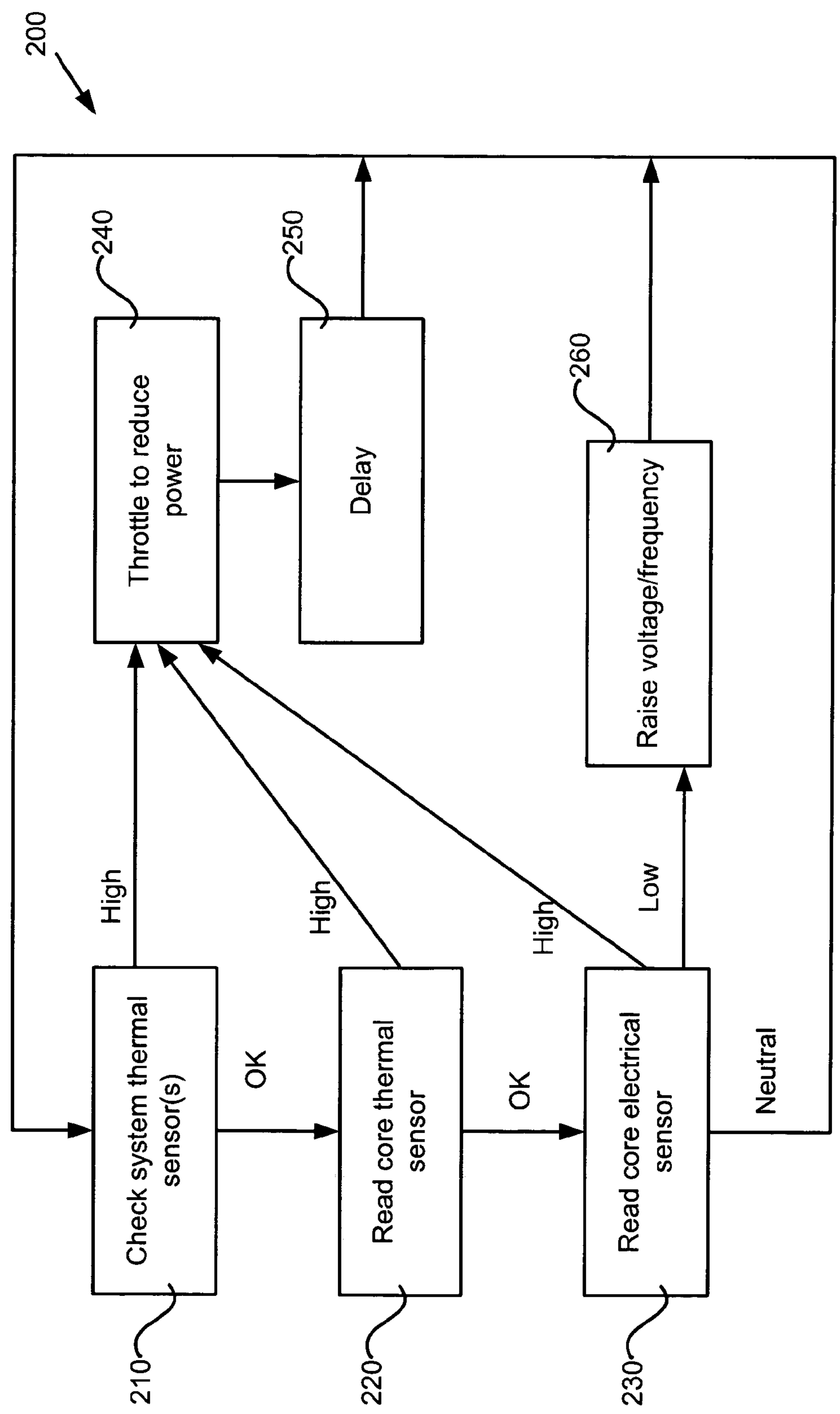
FIG. 2 is a flow chart illustrating a process of controlling processor operation with the principles of the invention.

FIG. 2 is a flow chart illustrating a process 200 of controlling the operation of processor 120 consistent with the principles of the invention. Although process 200 may be described with regard to system 100 for ease of explanation, the claimed invention is not limited in this regard. Processing may begin with power management unit 125 receiving thermal data from one or more of sensors 115 and 135 in other portions of system 100, and checking whether this thermal data exceeds one or more certain thresholds [act 210]. In some implementations, sensors 115 and 135 may determine whether a threshold has been exceeded and may send power management unit 125 an indication that their respective thermal threshold has or has not been exceeded.

In some implementations, however, sensors 115 and 135 may not be present, and in such implementations, act 210 may be skipped. In other implementations, sensors 115 and 135 may be checked with different frequency. For example, a more temperature-varying or temperature-sensitive portion of system 100 (e.g., downstream portion 130) may be checked every time act 210 is performed, but another portion (e.g., upstream portion 110) may be checked less frequently.

If one or more of the temperature thresholds that are associated with sensors 115 and 135 are exceeded, power management unit 125 may throttle one or more of cores 121–124 to reduce their power used [act 240]. As mentioned previously, such throttling may include reducing the voltage, frequency, or both for cores 121–124. The throttle condition may be forced for a period with some delay to prevent the system from oscillating between the operating points [act 250]. Such delay times may range, for example, from one micro-seconds to tens of milli-seconds. In addition, a thermal sensor with a thermometer output may provide more detailed thermal data and limit prevent increasing the processor frequency when the temperature nears the threshold.

If the system temperature threshold(s) are determined to be in an acceptable range in act 210, however, power management unit 125 may check data from one or more thermal sensors associated with cores 121–124 [act 220]. If a core thermal threshold (e.g., 100° C.) has been exceeded, power management unit 125 may throttle one or more of the cores 121–124 in act 240.

If the core temperature threshold(s) are determined to be in an acceptable range in act 220, power management unit 125 may check data from one or more electrical power sensors associated with cores 121–124 [act 230]. If the core electrical power is within an acceptable range, power management unit 125 may return to act 210, perhaps after some delay (not shown). If the electrical power used in cores 121–124 exceeds an acceptable value (e.g., 120 W), power management unit 125 may throttle one or more of cores 121–124 to reduce their power used in act 240. Such power-based throttling may prevent or lessen voltage droop in power supply 140.

In some implementations, if the core electrical power is on the low side of a typical range, power management unit 125 may raise the voltage/frequency of one or more of cores 121–124 to increase their performance [act 260]. The voltage, frequency, or both, may be increased to cores 121–124 to obtain increased performance when system 100 is within acceptable temperature and power operating parameters. Such an increase may be performed on a per-core basis or for a group of cores 121–124. It may also be performed on an ad-hoc basis depending on which one(s) of cores 121–124 are carrying more of a computational load (e.g., are running "higher power" applications).

Although FIG. 2 illustrates a certain order for acts 210–230, in some implementations the order of these acts may be different or they may be performed roughly in parallel. Also, although the thermal power threshold and the electrical power threshold for cores 121–124 have been described as being different (e.g., 100 W and 120 W, respectively), these thresholds may be roughly the same in some implementations. In some implementations, the thermal power threshold may exceed the electrical power threshold. In certain applications, the scheme described herein may be referred to as "hyper-throttling."

Figure 3:
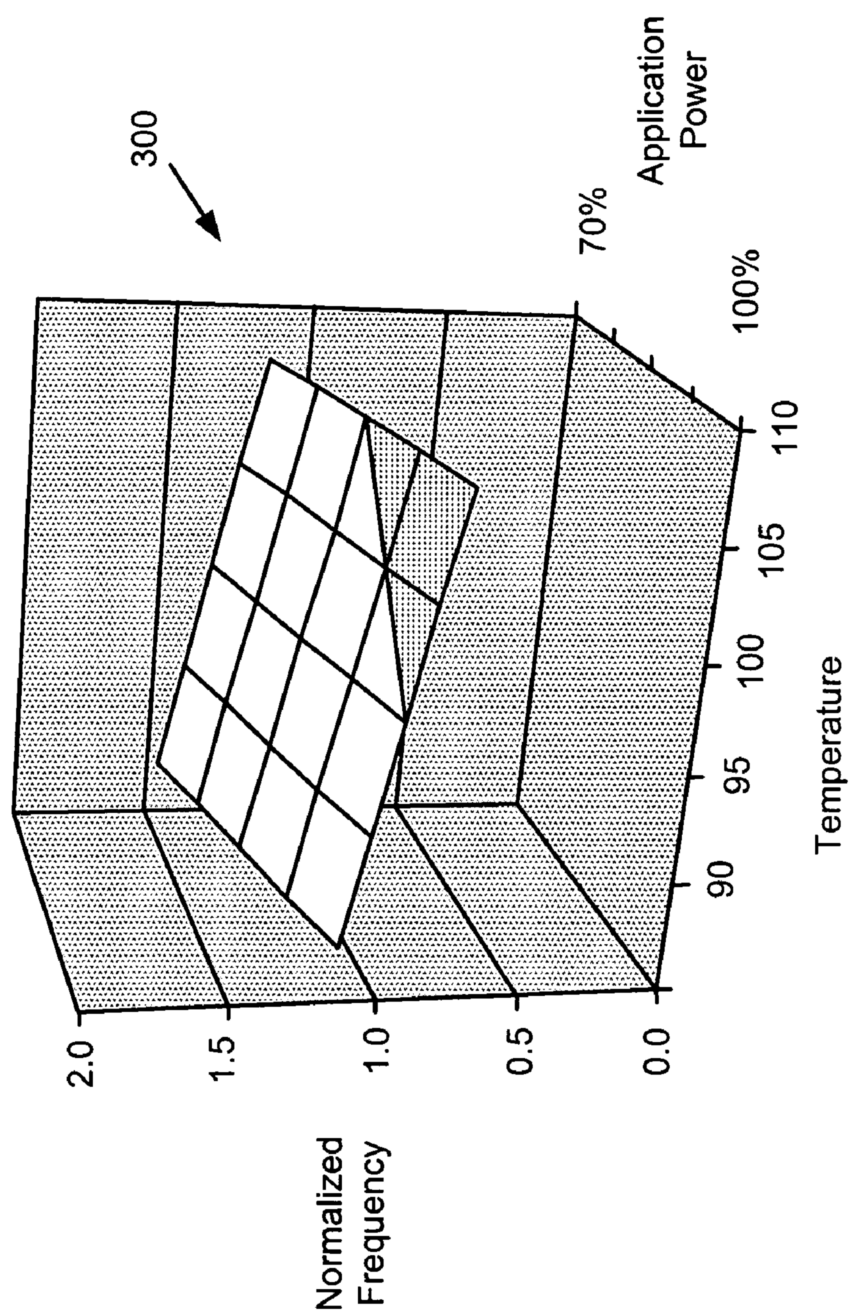
FIG. 3 illustrates a plot of operating conditions consistent with the principles of the invention.

FIG. 3 illustrates a three-dimensional plot of operating conditions 300 associated with processor 120 consistent with the principles of the invention. The upper, lightly-shaded portion of plot 300 has a normalized frequency greater than 1.0, while the lower, more heavily-shaded portion of plot 300 has a normalized frequency less than 1.0. Lower system temperatures of processor 120 along the temperature axis on plot 300 allow increasing the frequency of cores 121–124 by moving an operating point vertically (e.g., along the normalized frequency axis) on plot 300. Applications that draw less than the maximum power dissipation on processor 120 also allow increasing the frequency of cores 121–124 by moving an operating point vertically. Thus typical environment and application conditions allow higher performance if worst case assumptions were used. However, increasing the frequency and power dissipation of processor 120 may increase the thermals at other areas of the system. Hence, sensors at 110 and 130 may need to be used by the power management unit 125 to protect the thermal solution of the entire system 100.

When a throttling scheme as described above, system 100 may be designed in one of several ways relative to a typical system with roughly equal electrical and thermal power thresholds. For example, the electrical power threshold associated with processor 120 may remain the same as that of a typical system, and the thermal threshold associated with processor 120 may be reduced relative to the typical system. Such a scheme may lower costs of the associated thermal cooling system needed to meet the lowered thermal threshold. In another example, the electrical power threshold associated with processor 120 may be raised relative to that of a typical system, and the thermal threshold associated with processor 120 may remain roughly the same. Such a scheme may increase performance of system 100 relative to a typical system, while using substantially the same cooling system.

The foregoing description of one or more implementations consistent with the principles of the invention provides illustration and description, but is not intended to be exhaustive or to limit the scope of the invention to the precise form disclosed. Modifications and variations are possible in light of the above teachings or may be acquired from practice of various implementations of the invention.

For example, in some implementations processor 120 may be arranged so not to impact portion 110 and/or portion 130. In such implementations, or in other implementations where portions 110/130 are not present, one or more of thermal sensors 115 and 135 may be omitted from the above-described scheme. Alternately, data from such thermal sensors 115/135 may be received, but not used by power management unit 125. Moreover, in some implementations, data from thermal sensors in system 100 may be provided in an absolute, possibly digital, format. Power management unit 125 may, in certain implementations, both throttle and/or increase the performance of processor 120 (e.g., see act 260) depending on the temperature value from a given thermal sensor. In such implementations, finer control of processor 120 may be possible, because the thermal sensors may provide more information (e.g., the absolute temperature) than an indication that a temperature threshold has been exceeded.

Moreover, the acts in FIG. 2 need not be implemented in the order shown; nor do all of the acts necessarily need to be performed. Also, those acts that are not dependent on other acts may be performed in parallel with the other acts. Further, at least some of the acts in this figure may be implemented as instructions, or groups of instructions, implemented in a machine-readable medium.

No element, act, or instruction used in the description of the present application should be construed as critical or essential to the invention unless explicitly described as such. Also, as used herein, the article "a" is intended to include one or more items. Where only one item is intended, the term "one" or similar language is used. Variations and modifications may be made to the above-described implementation (s) of the claimed invention without departing substantially from the spirit and principles of the invention. All such modifications and variations are intended to be included herein within the scope of this disclosure and protected by the following claims.

What is claimed:

1. An apparatus, comprising:
- a processor core;
- a thermal sensor proximate to the processor core;
- an electrical power sensor proximate to the processor core; and
- a power management unit to control the processor core based on a thermal power threshold and an electrical power threshold that is different from the thermal power threshold.

2. The apparatus of claim 1, wherein the electrical power threshold is higher than the thermal power threshold.

3. The apparatus of claim 1, wherein the thermal power threshold is higher than the electrical power threshold.

4. The apparatus of claim 1, wherein the power management unit is arranged to throttle the processor core if the thermal power threshold or the electrical power threshold is exceeded.

5. The apparatus of claim 1, wherein the power management unit is arranged to increase a voltage or a frequency of the processor core if data from the electrical power sensor does not exceed a low power threshold.

6. The apparatus of claim 1 further comprising:
- another processor core,
- wherein the power management unit is arranged to control operation of either one of the processor core and the another processor core based on a thermal power threshold and an electrical power threshold that is different from the thermal power threshold.

7. The apparatus of claim 6, wherein the power management unit is arranged to control operation of both the processor core and the another processor core at the same time.

8. The apparatus of claim 1, wherein the power management unit is arranged to receive thermal data from an external thermal sensor that is external to the apparatus, and
- wherein the power management unit is further arranged to control the processor core based on data from the thermal sensor, data from the electrical power sensor, and the thermal data from the external thermal sensor.

9. A system, comprising:
- a first portion, including:
  - a first thermal sensor to provide first thermal data;
- a processor, including:
  - a core,
  - a core thermal sensor to provide core thermal data,
  - an electrical power sensor to provide electrical data, and a power management unit to selectively throttle the core based on the first thermal data, the core thermal data, and the electrical data.

10. The system of claim 9, wherein the power management unit is arranged to throttle the core if the first thermal data exceeds a first thermal threshold.

11. The system of claim 10, wherein the power management unit is arranged to throttle the core if the core thermal data exceeds a second thermal threshold.

12. The system of claim 10, wherein the power management unit is arranged to throttle the core if the electrical data exceeds an electrical power threshold.

13. The system of claim 9, wherein the power management unit is arranged to increase performance of the core if the electrical data falls below a low electrical power threshold.

14. The system of claim 13, wherein the power management unit is arranged to increase the performance of the core by increasing one or more of a voltage of the core or a frequency of the core.

15. The system of claim 9, further comprising:

a device to generate directional airflow across the first portion and the processor, wherein the first portion is located downstream in the airflow from the processor.

16. The system of claim 9, further comprising:

a second portion, including:

a second thermal sensor to provide second thermal data, wherein the power management unit is arranged to selectively throttle the core based on the first thermal data, the second thermal data, the core thermal data, and the electrical data.

17. A method, comprising:

checking first thermal data from a first component;

reading second thermal data from a second component;

examining electrical data from the second component; and selectively reducing power consumption of the second component based on the first thermal data, the second thermal data, and the electrical data.

18. The method of claim 17, further comprising:

delaying for a time after reducing the power consumption of the second component.

19. The method of claim 18, further comprising:

repeating the checking, the reading, the examining, and the selectively reducing after the delaying for a time.

20. The method of claim 17, wherein the reading second thermal data and the examining electrical data are performed if the first thermal data does not exceed a threshold.

21. The method of claim 17, further comprising:

selectively increasing power consumption of the second component based on the electrical data.

22. The method of claim 21, wherein the selectively increasing power consumption includes increasing a voltage to the second component, increasing a frequency of the second component, or enabling a portion of the second component.

23. A method, comprising:

checking first thermal data from a first portion;

reading second thermal data from a processor;

examining electrical data from the processor;

decreasing power consumption of the processor if the first thermal data exceeds a first threshold, if the second thermal data exceeds a second threshold, or if the electrical data exceeds third threshold; and increasing power consumption of the processor if the electrical data is lower than a fourth threshold.

24. The method of claim 23, further comprising:

delaying for a time after decreasing power consumption of the processor.

25. The method of claim 23, further comprising:

leaving the power consumption of the processor unaltered if the electrical data is between the third and fourth thresholds.

* * * * *